(12) United States Patent
Ito et al.

(10) Patent No.: US 6,624,644 B2
(45) Date of Patent: *Sep. 23, 2003

(54) ELECTRO-OPTIC PROBE AND MAGNETO-OPTIC PROBE

(75) Inventors: Akishige Ito, Tokyo (JP); Yoshiki Yanagisawa, Tokyo (JP); Jun Kikuchi, Tokyo (JP); Nobukazu Banjo, Tokyo (JP); Sanjay Gupta, Tokyo (JP); Mitsuru Shinagawa, Tokyo (JP); Tadao Nagatsuma, Tokyo (JP); Hakaru Kyuragi, Tokyo (JP)

(73) Assignees: Ando Electric Co., Ltd., Tokyo (JP); Nippon Telegraph and Telephone Corporation, Tokyo (JP)

( * ) Notice: Subject to any disclaimer, the term of this patent is extended or adjusted under 35 U.S.C. 154(b) by 65 days.

This patent is subject to a terminal disclaimer.

(21) Appl. No.: 09/899,375

(22) Filed: Jul. 2, 2001

(65) Prior Publication Data

US 2002/0008533 A1 Jan. 24, 2002

(30) Foreign Application Priority Data

Jul. 5, 2000 (JP) ........................................ 2000-204251

(51) Int. Cl.⁷ ............................................ G01R 31/308
(52) U.S. Cl. ....................... 324/753; 324/750; 324/752; 324/760
(58) Field of Search ............................... 324/750, 753, 324/754, 755, 752, 760, 96, 76.36, 158.1, 260, 262; 250/310, 339.03; 356/364, 368; 350/96.15

(56) References Cited

U.S. PATENT DOCUMENTS

| 5,434,698 A | 7/1995 | Takano et al. ............... 359/247 |
| 5,493,222 A | 2/1996 | Shirai et al. ............... 324/244.1 |
| 5,642,040 A | 6/1997 | Takahashi et al. ............ 324/96 |
| 5,808,473 A * | 9/1998 | Shinagawa et al. ......... 324/753 |
| 6,407,561 B1 * | 6/2002 | Ito .............................. 324/753 |
| 6,429,669 B1 * | 8/2002 | Ito .............................. 324/753 |

FOREIGN PATENT DOCUMENTS

| EP | 0293841 A1 | 12/1988 | ........... G01R/15/07 |
| GB | 2342160 | 4/2000 | ........... G01R/15/24 |
| JP | 6-066845 | 3/1994 | ........... G01R/19/00 |
| JP | 8-094692 | 4/1996 | ........... G01R/29/10 |
| JP | 8-304516 | 11/1996 | ......... G01R/31/302 |
| JP | 9-089940 | 4/1997 | ........... G01R/19/00 |
| JP | 11-174088 | 7/1999 | ........... G01R/13/40 |
| JP | 2000-180477 | 6/2000 | ........... G01R/13/40 |

OTHER PUBLICATIONS

E. Philippow, Taschenbuch Elektrotechnik Band 3, Auflage 1978, ISBN 3–446–12310–5, Seiten 138, 139.

* cited by examiner

*Primary Examiner*—Kamand Cuneo
*Assistant Examiner*—Trung Q. Nguyen
(74) *Attorney, Agent, or Firm*—Darby & Darby

(57) ABSTRACT

An electro-optic probe has a laser diode for emitting a laser beam in accordance with a control signal from a measuring instrument main body, an electro-optic or magneto-optic element provided with a reflection film on an end surface thereof, a separator provided between the laser diode and electro-optic or magneto-optic element which is pervious the laser beam emitted from the laser diode and separates a beam reflected from the reflection film and two photodiodes which transform the beam reflected by the separator. A member of weak dielectric material, such as a glass plate, overlies the electro-optic or magneto-optic element at the end of the probe to protect the element, or the element is at the end of the probe and is exposed.

10 Claims, 2 Drawing Sheets

ELECTRO-OPTIC PROBE AND MAGNETO-OPTIC PROBE

BACKGROUND OF THE INVENTION

1. Field of the Invention

The present invention relates to an electro-optic probe using an electro-optic element and a magneto-optic probe using a magneto-optic element.

2. Description of the Related Art

It is possible to observe the waveform of a measured signal by acting an electric field generated by measured signal on an electro-optic crystal, irradiating laser beam onto the electro-optic crystal, and observing the waveform of the measured signal by the state of polarization of the laser beam. In this case, the laser beam is given the form of light pulses and the measured signal then sampled, the observation can be made at an extremely high time resolution. The electro-optic sampling probe utilizes an electro-optic probe that makes use of this principle.

The electro-optic sampling oscilloscopes (hereinafter shortened to EOS oscilloscopes), have the following remarkable features compared with conventional sampling oscilloscopes using electric probes.

(1) The signal is easily measured since a ground wire becomes unnecessary when the measurement is performed.

(2) A high input impedance can be obtained since the metal pin on the tip of the electro-optic probe is insulated from the circuit system, and therefore, the point that is measured is not significantly disturbed.

(3) The measurement can be performed over a wide range of frequencies including the order of GHz since pulsed light is used (however, continuous light can also be used).

The structure of a conventional electro-optic probe which is used for signal measurement by an EOS oscilloscope will be explained with reference to FIG. 2. In FIG. 2, reference numeral 1 denotes a probe-head made of an insulator, and a metal pin 1a is set in the center thereof. Reference numeral 2 denotes an electro-optic element, and a reflection film 2a is provided on the end surface of the electro-optic element 2 so as to face and contact with the metal pin 1a. Reference numerals 3 and 8 denote collimator lenses, reference numeral 4 denotes a ¼ wavelength plate, and reference numerals 5 and 7 denote polarizing beam splitters. Reference numeral 6 denotes a Faraday element for rotating a plane of polarization of an incident light by an angle of 45 degrees. Reference numeral 9 denotes a laser diode for emitting a laser beam in accordance with a control signal which is output by a pulse generating circuit (not shown) of an EOS oscilloscope main body 19. Reference numerals 10 and 11 denote collimator lenses, and reference numerals 12 and 13 denote photodiodes for outputting an electric signal corresponding to the input laser beam to the EOS oscilloscope main body 19. Furthermore, reference numeral 14 denotes a separator which is composed of the ¼ wavelength plate 4, polarizing beam splitters 5, 7, and Faraday element 6; and reference numeral 15 denotes the main body of the probe, made of an insulator.

Next, the light pathway of the laser beam which is emitted by the laser diode 9 will be explained with reference to FIG. 2. In FIG. 2, reference number A denotes the light path of the laser beam.

The laser beam emitted by the laser diode 9 is converted to a parallel light beam by the collimator lens 8 and goes straight through the polarizing beam splitter 7, Faraday element 6, and polarizing beam splitters 5. The laser beam is further passed through the ¼ wavelength plate 4 and collected by the collimator lens 3, and enters into the electro-optic element 2. This laser beam is reflected by the reflection film 2a which is provided on the end surface of the electro-optic element 2 which faces the metal pin 1a.

The reflected laser beam is converted to a parallel light beam again by the collimator lens 3 and passes through the ¼ wavelength plate 4. A part of this laser beam is reflected by the polarizing beam splitter 5 and enters the photodiode 12, and the laser beam which passes through the polarizing beam splitter 5 is reflected by the polarizing beam splitter 7 and entered into the photodiode 13. Here, the intensities of the laser beams which enter the photodiodes 12, 13 are adjusted by the ¼ wavelength plate 4 so as to the same level.

Next, the operation for measuring the measured signal using the electro-optic probe shown in FIG. 2 will be explained.

When the metal pin 1a contacts the measured point, change in the electric field around the metal pin 1a caused by the voltage which is applied to the metal pin 1a is transmitted to the electro-optic element 2, and the double refractive index of the electro-optic element 2 is varied by the Pockels effect. As a result, the polarization of the laser beam changes when the laser beam enters and is transmitted through the electro-optic element 2. The laser beam, with a changed polarization, is reflected by the reflection film 2a and enters the photodiodes 12, 13, and converted to an electric signal.

Namely, the change in polarization of the laser beam, according to the change in voltage at the measured point, is converted to a difference between the output signals of the photodiodes 12, 13 by means of the electro-optic element 2, and the electric signal which is applied to the metal pin 1a can be measured by detecting this difference.

Furthermore, in the electro-optic probe as described above, the electric signals from the photodiodes 12, 13 are input and processed in the EOS oscilloscope. However, the measured signal can be also observed by connecting a conventional measuring instrument, such as a real-time oscilloscope, to the photodiodes 12, 13 via an exclusive controller. As described above, the measurement of electric signals using the electro-optic probe can be easily performed over a wide range of frequencies.

However, in a conventional electro-optic probe, since the metal pin 1a contacts the measured point as described above, electric field cannot be measured without disturbing the electric field. Thus, it is possible to improve on conventional electro-optic probes in this point.

The present invention is provided in consideration of the above circumstances, and an object of the present invention is to provide an electro-optic probe which can measure the electric field without disturbing the electric field, and a magneto-optic probe which is provided by partly changing the electro-optic probe and can measure the magnetic field without disturbing the magnetic field.

SUMMARY OF THE INVENTION

In order to achieve these objects, the first aspect of the present invention is an electro-optic probe comprising: a laser diode for emitting a laser beam in accordance with a control signal from a measuring instrument main body, an electro-optic element, provided with a reflection film on an end surface thereof, a separator provided between the laser diode and electro-optic element, and which is pervious to the laser beam emitted by the laser diode and separates a beam reflected from the reflection film, two photodiodes which transform the beam reflected by the separator into an electric signal, and a weak dielectric substance used for protecting the electro-optic element.

In this electro-optic probe, the weak dielectric substance can be made of glass, for example.

The second aspect of the present invention is an electro-optic probe comprising:, a laser diode for emitting a laser beam in accordance with a control signal from a measuring instrument main body, an electro-optic element, provided with a reflection film on an end surface thereof, a separator provided between the laser diode and electro-optic element, and which is pervious to the laser beam emitted by the laser diode and separates a beam reflected from the reflection film, and two photodiodes which transform the beam reflected by the separator into an electric signal, wherein the electro-optic element is exposed to the outside of the probe.

Furthermore, the first aspect of the present invention is a magneto-optic probe comprising: a laser diode for emitting a laser beam in accordance with a control signal from a measuring instrument main body, a magneto-optic element, provided with a reflection film on an end surface thereof, a separator provided between the laser diode and magneto-optic element, and which is pervious to the laser beam emitted by the laser diode and separates a beam reflected from the reflection film, two photodiodes which transform the beam reflected by the separator into an electric signal, and a weak dielectric substance used for protecting the magneto-optic element.

In this magneto-optic probe, the weak dielectric substance can be made of a glass, for example.

The second aspect of the present invention is a electro-optic probe comprising:, a laser diode for emitting a laser beam in accordance with a control signal from a measuring instrument main body, a magneto-optic element, provided with a reflection film on an end surface thereof, a separator provided between the laser diode and magneto-optic element, and which is pervious to the laser beam emitted by the laser diode and separates a beam reflected from the reflection film, and two photodiodes which transform the beam reflected by the separator into an electric signal, wherein the magneto-optic element is exposed to the outside of the probe.

DESCRIPTION OF THE PREFERRED EMBODIMENTS

Figure 1:
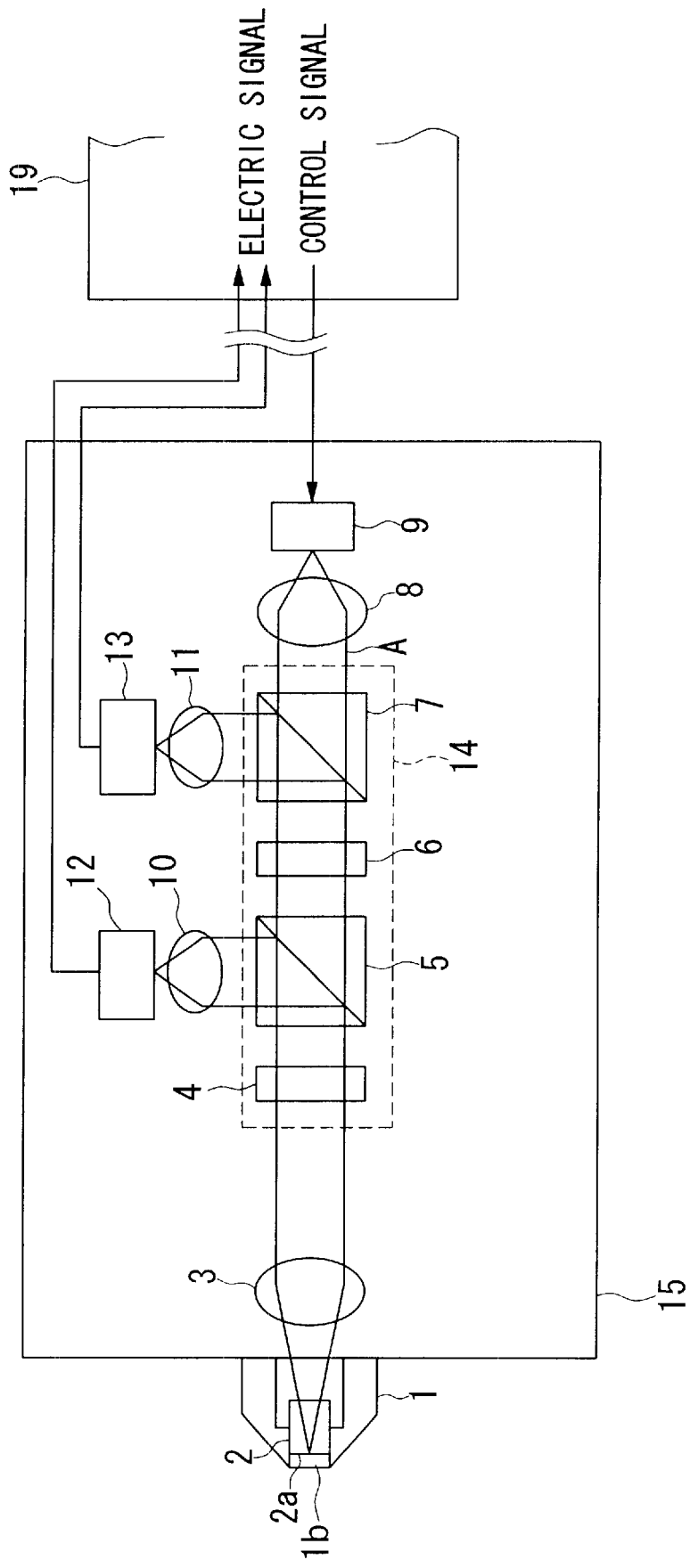
FIG. 1 is a schematic diagram showing an embodiment of the electro-optic probe of the present invention.

One of the preferred embodiments of the electro-optic probe of the present invention will be explained in the following with reference to FIG. 1. FIG. 1 is a schematic diagram of this embodiment of the electro-optic probe. In FIG. 1, reference numeral 1 denotes a probe-head made of an insulator, with a glass plate 1b is set in the center thereof so as to face the outer side of the probe. Reference numeral 2 denotes an electro-optic element made of CdTe, for example. The electro-optic element 2 is fastened to the probe-head 1 with or without contacting the glass plate 1b, and a reflection film 2a is provided on the end surface of the electro-optic element 2 so as to face the glass plate 1b. Here, CdTe or BSO may be used as the electro-optic element 2 when the electric field along the longitudinal direction (parallel with the laser beam) is measured. However, other electro-optic elements for measuring the electric field along the transverse direction may be also used. Reference numerals 3 and 8 denote collimator lenses, reference numeral 4 denotes a ¼ wavelength plate, and reference numerals 5 and 7 denote polarizing beam splitters. Reference numeral 6 denotes a Faraday element for rotating a plane of polarization of an incident light by an angle of 45 degrees. Reference numeral 9 denotes a laser diode for emitting a laser beam according to a control signal which is outputted by a pulse generating circuit (not shown) of a EOS oscilloscope main body 19. Reference numerals 10 and 11 denote collimator lenses, and reference numerals 12 and 13 denote photodiodes for outputting an electric signal corresponding to the inputted laser beam to the EOS oscilloscope main body 19. Furthermore, reference numeral 14 denotes a separator which is composed of the ¼ wavelength plate 4, polarizing beam splitters 5, 7 and Faraday element 6; and reference numeral 15 denotes a main body of the probe, made of an insulator.

Figure 2:
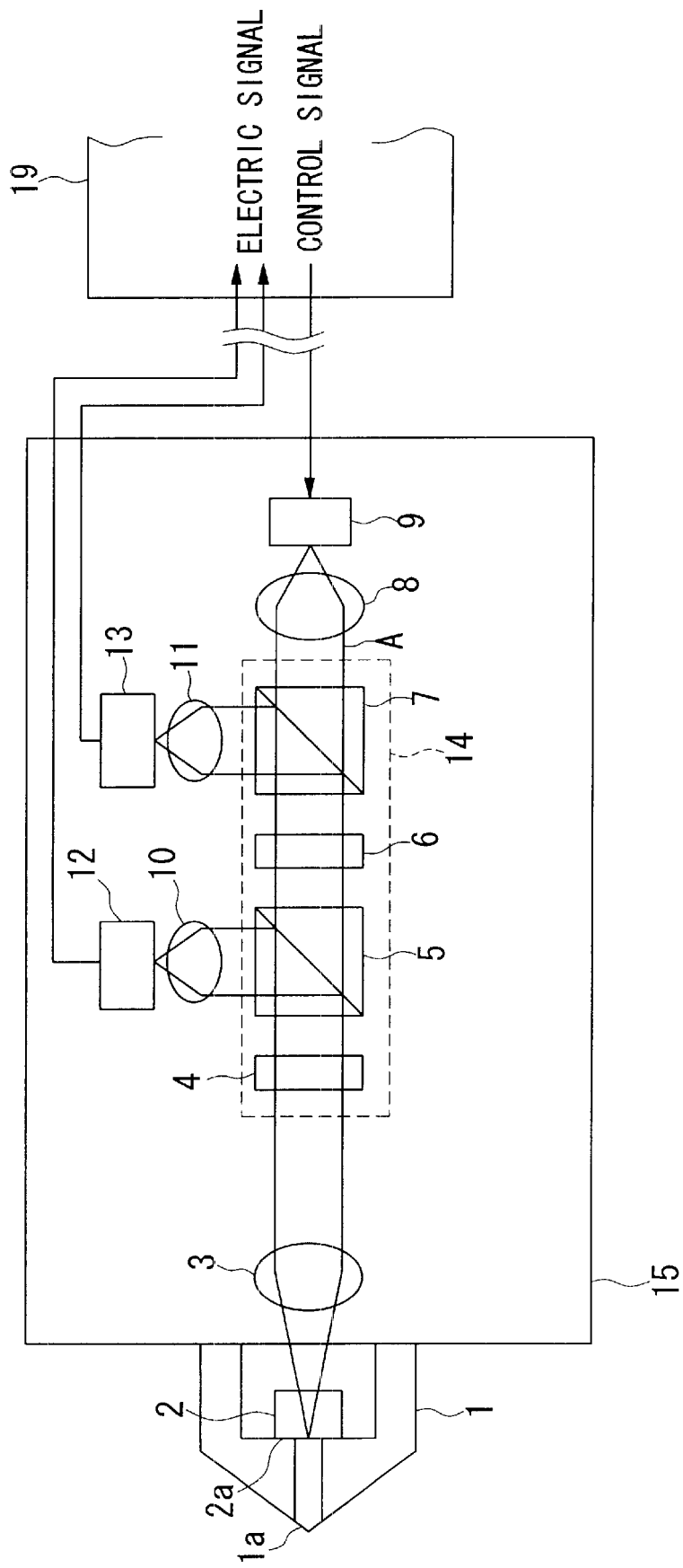
FIG. 2 is a schematic diagram showing an embodiment of the conventional electro-optic probe.

The electro-optic probe of this embodiment shown in FIG. 1 is different from conventional electro-optic probes in a point that the glass plate 1b is provided at the tip portion of the electro-optic element 2. The thickness of the glass plate 1b along the axis of the probe is about 100 $\mu$m, for example. Furthermore, a material which has a weak dielectric substance is used for the glass plate 1b in order to reduce the effects on any magnetic field around the probe. Otherwise, in the electro-optic probe of this embodiment, the path A of the laser beam which is emitted by the laser diode 9 is the same as that of the conventional electro-optic probe shown in FIG. 2.

Next, the operation for measuring the measured signal using this electro-optic probe will be explained.

When the glass plate 1b which functions as a detecting part positioned at a location to be measured, the electric field at this location is directly transmitted to the electro-optic element 2 through the glass plate 1b, and the double refractive index of the electro-optic element 2 is varied by the Pockels effect. As a result, the polarization of the laser beam emitted by the laser diode 9 and which enters the electro-optic element 2 is changed when the laser beam is transmitted through the electro-optic element 2. The laser beam, after its polarization is changed, is reflected by the reflection film 2a, enters the photodiode 12, 13, and is converted into an electric signal.

In this electro-optic probe, a change in the polarization of the laser beam in accordance with a change in the electric field at the measured point is converted into a difference between the output signals of the photodiodes 12, 13 by means of the electro-optic element 2, and the electric field at the spatial location of the glass plate 1b can be directly measured by detecting this difference. Therefore, the electric field can be directly measured either contacting the electro-optic element 2 or disturbing the electric field, and as a result, the electric field distribution can be also measured. Furthermore, damage to the electro-optic element 2 can be prevented since the electro-optic element 2 is protected by the glass plate 1b. It is a matter of course that the electric field of a specific object can be also measured by the electro-optic probe without contacting the electro-optic element 2 with the object.

In addition, electro-optic element 2 of the above-described embodiment may be changed to a magneto-optic element such as a magnetic monocrystal garnet in order to provide a magneto-optic probe. In this magneto-optic probe, the magnetic field and the distribution thereof can be directly measured either contacting the magneto-optic element or disturbing the magnetic field. It is a matter of course that the magnetic field of a specific object can be also measured by the magneto-optic probe without contacting the magneto-optic element with the object.

Furthermore, the electro-optic or magneto-optic element may be exposed to the outside of the probe without the glass plate 1b. In this case, the electric or magnetic field in the space can be also directly measured without disturbing the electric or magnetic field.

What is claimed is:

1. An electro-optic probe comprising:

a laser diode for emitting a laser beam in accordance with a control signal from a measuring instrument main body, an electro-optic element provided with a reflection film on an end surface thereof located at one end of said probe, a separator provide between said laser diode and electro-optic element, and which is pervious to said laser beam emitted by said laser diode and separates a beam reflected from said reflection film, two photodiodes which transform said beam reflected by said separator into an electric signal, and a member of a weak dielectric material overlying said electro-optic element to form the outer surface of the probe said one end to protect said electro-optic element.

2. An electro-optic probe according to claim 1, wherein said member of weak dielectric material is made of a glass.

3. A magneto-optic probe according to claim 1, wherein said member of weak dielectric material is made of a glass.

4. An electro-optic probe as claimed in claim 1 further comprising:

a head at said one end of the probe in which said electro-optic element and said member of a weak dielectric material are mounted.

5. An electro-optic probe comprising:

a laser diode for emitting a laser beam in accordance with a control signal from a measuring instrument main body, an electro-optic element provided with a reflection film on an end surface thereof located at one end of said probe, a separator provided between said laser diode and electro-optic element, and which is pervious to said laser beam emitted by said laser diode and separates a beam reflected from said reflection film, two photodiodes which transform said beam reflected by said separator into an electric signal, and wherein said electro-optic element is exposed as an end surface of said one end of the probe.

6. An electro-optic probe as claimed in claim 5 further comprising:

a head at said one end of the probe in which said electro-optic element is mounted.

7. A magneto-optic probe comprising:

a laser diode for emitting a laser beam in accordance with a control signal from a measuring instrument main body, a magneto-optic element provided with a reflection film on an end surface thereof located at one end of said probe, a separator provided between said laser diode and magneto-optic element, and which is pervious to said laser beam emitted by said laser diode and separates a beam reflected from said reflection film, two photodiodes which transform said beam reflected by said separator into an electric signal, and a member of a weak dielectric material overlying said magneto-optic element to form the outer surface of the probe said one end to protect said magneto-optic element.

8. A magneto-optic probe as claimed in claim 7 further comprising:

a head at said one end of the probe in which said magneto-optic element and said member of a weak dielectric material are mounted.

9. A magneto-optic probe comprising:

a laser diode for emitting a laser beam in accordance with a control signal from a measuring instrument main body, a magneto-optic element provided with a reflection film on an end surface thereof located at one end of said probe, a separator provided between said laser diode and magneto-optic element, and which is pervious to said laser beam emitted by said laser diode and separates a beam reflected from said reflection film, and two photodiodes which transform said beam reflected by said separator into an electric signal, wherein said magneto-optic element is exposed as an end surface of said one of the probe.

10. A magneto-optic probe as claimed in claim 9, further comprising:

a head at said one end of the probe in which said magneto-optic element is mounted.

* * * * *